US008212628B1

(12) United States Patent
Tsironis

(10) Patent No.: US 8,212,628 B1
(45) Date of Patent: Jul. 3, 2012

(54) HARMONIC IMPEDANCE TUNER WITH FOUR WIDEBAND PROBES AND METHOD

(76) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 12/457,187

(22) Filed: Jun. 3, 2009

(51) Int. Cl.
*H03H 7/38* (2006.01)

(52) U.S. Cl. ........................................ 333/17.3; 33/263

(58) Field of Classification Search ................ 333/17.3, 333/263; 324/76, 49, 76.11, 76.51, 642
See application file for complete search history.

(56) References Cited

U.S. PATENT DOCUMENTS

| | | | | |
|---|---|---|---|---|
| 6,297,649 | B1 | 10/2001 | Tsironis | |
| 6,674,293 | B1 | 1/2004 | Tsironis | |
| 7,135,941 | B1 | 11/2006 | Tsironis | |
| 7,280,012 | B2 * | 10/2007 | Boulerne | 333/263 |
| 2007/0052505 | A1 * | 3/2007 | Simpson | 333/263 |

OTHER PUBLICATIONS

Load Pull method: microwave encyclopedia-micorwaves 101, Apr. 5, 2009.

Advanced Design Systems (ADS); Agilent Technologies, 2000-2009, May 30, 2009.

Computer Controlled Microwave Tuner—CCMT, product note 41, Focus Microwaves, Jan. 1998.

MPT, a universal Multi-Purpose Tuner, product note 79, Focus Microwaves, Oct. 2004.

* cited by examiner

*Primary Examiner* — Stephen Jones

(57) ABSTRACT

A slide screw microwave impedance tuner has four independent carriages, which slide across a low loss slabline. Each carriage has one or two vertical axes and associated stepper motors and gear, allowing the precise positioning of RF probes (slugs) into the slot of the slabline at any horizontal or vertical position. Each RF probe generates wideband reflection when approaching the center conductor. The associated calibration and tuning software can identify combinations of tuner probe positions corresponding to reflection factors such as to create independent tuning at up to four different frequencies. In case of harmonic frequencies the coverage of the RF probes has to be at least two octaves, i.e.: maximum: minimum frequency ≧4:1; in practice frequency coverage is higher than 4:1, since most applications require a certain operation bandwidth; in the typical case of a fundamental frequency band of 1.8-2.5 GHz the frequency range covered by the RF probes needs to be 1.8 to 10 GHz, the maximum frequency being 4·2.5 GHz=10 GHz.

5 Claims, 16 Drawing Sheets

Four-probe, automated impedance tuner, capable of tuning four (harmonic) frequencies

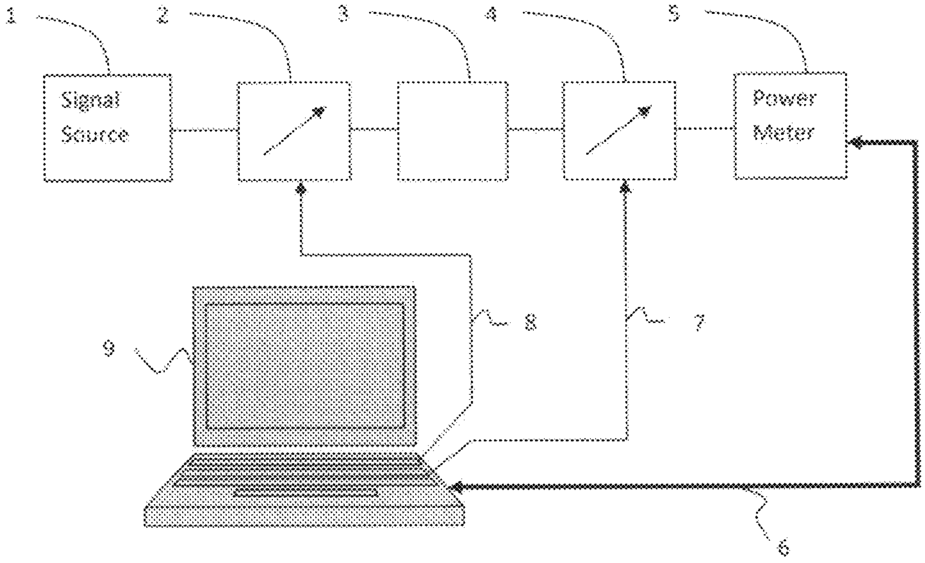
FIGURE 1: Prior art, automated load pull system, using fundamental and harmonic impedance tuners

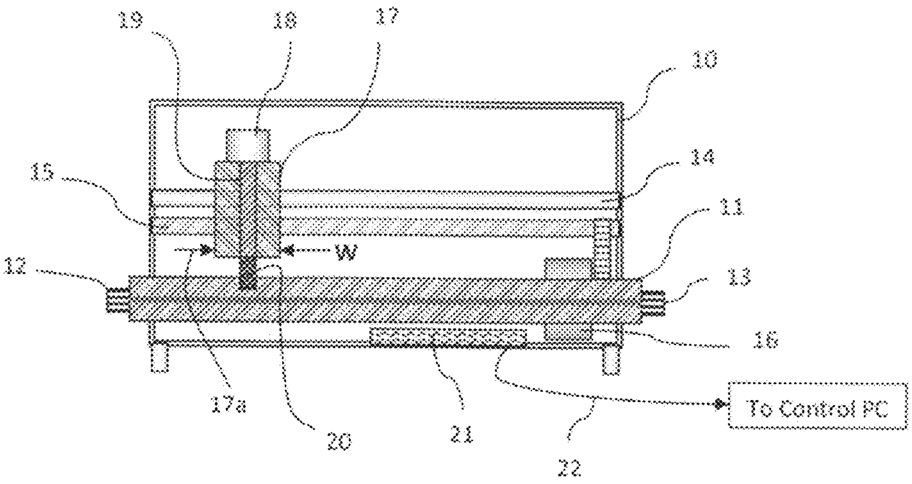
FIGURE 2: Prior art, single probe, wideband (fundamental) automated impedance tuner

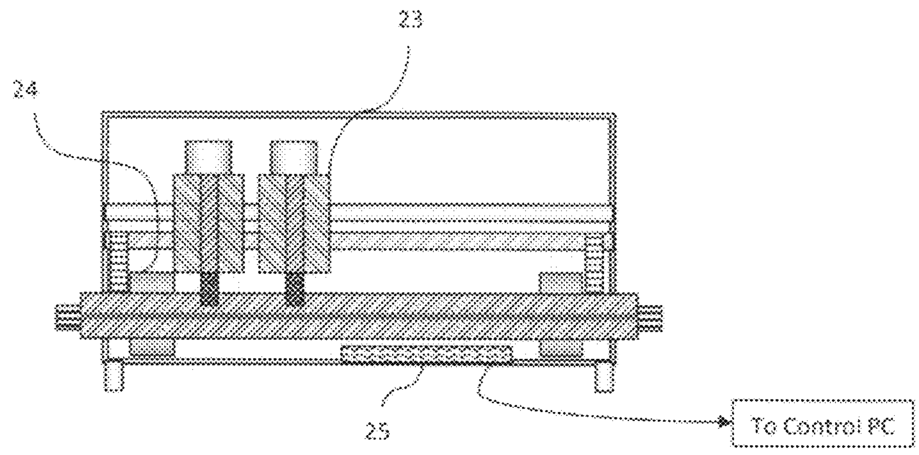
FIGURE 3: Prior art, two-probe, automated impedance tuner, capable of tuning two (harmonic) frequencies

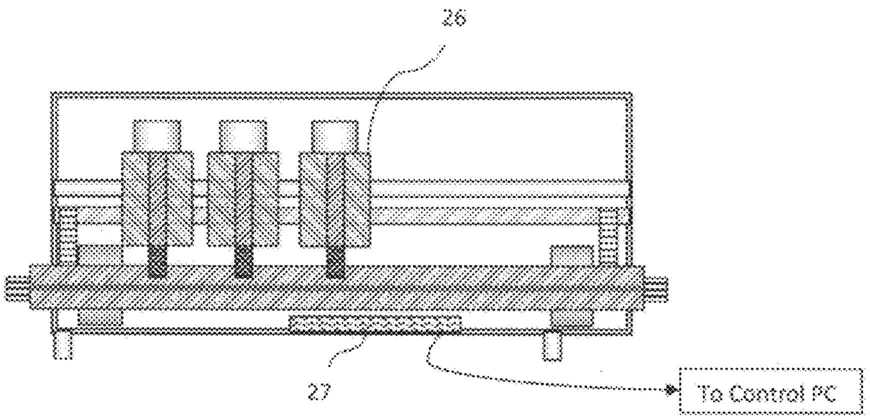
FIGURE 4: Prior art, triple-probe, automated impedance tuner, capable of tuning three (harmonic) frequencies

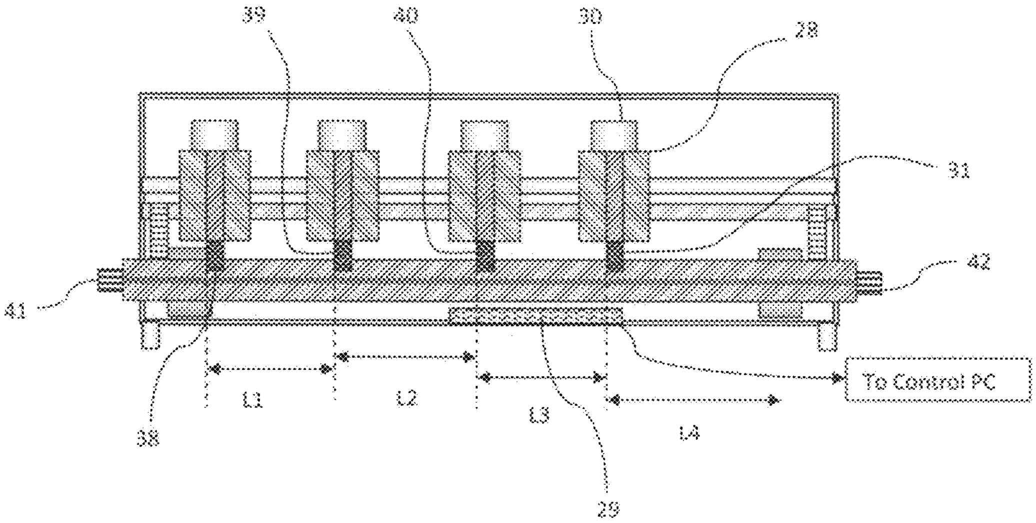
FIGURE 5: Four-probe, automated impedance tuner, capable of tuning four (harmonic) frequencies

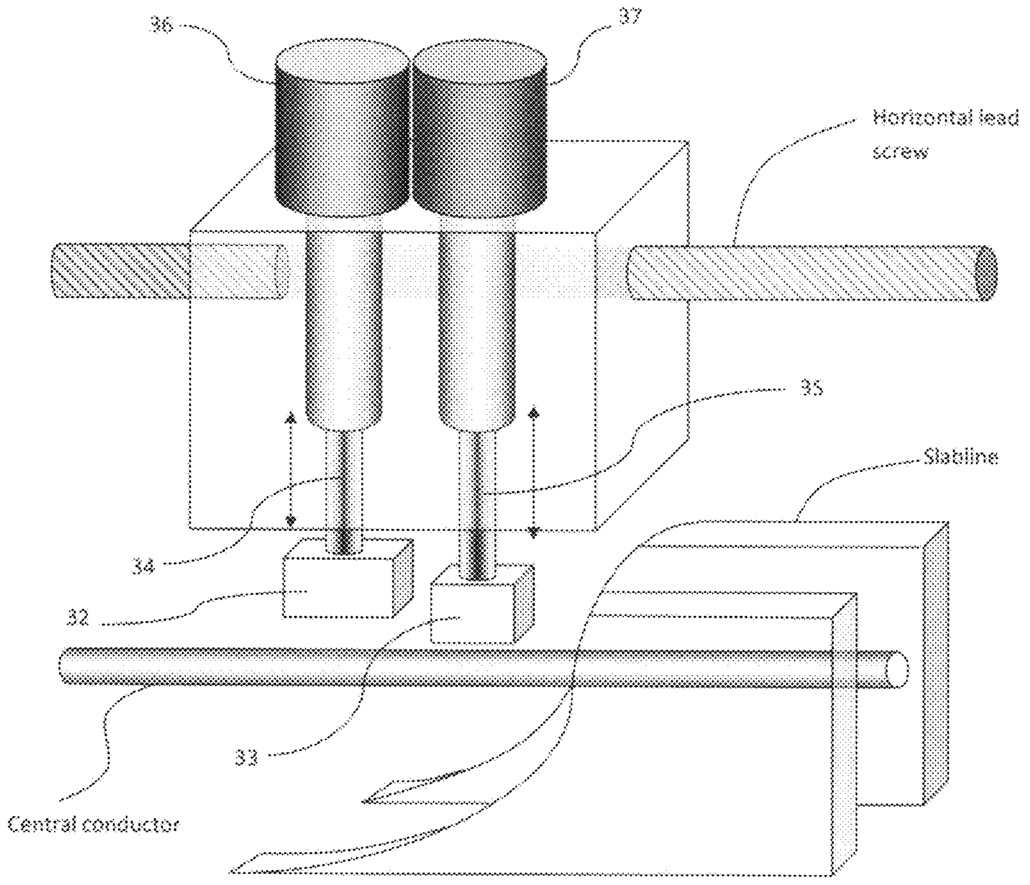
FIGURE 6: Prior art: Double-carriage for four probe automated impedance tuner, capable of tuning four (harmonic) frequencies.

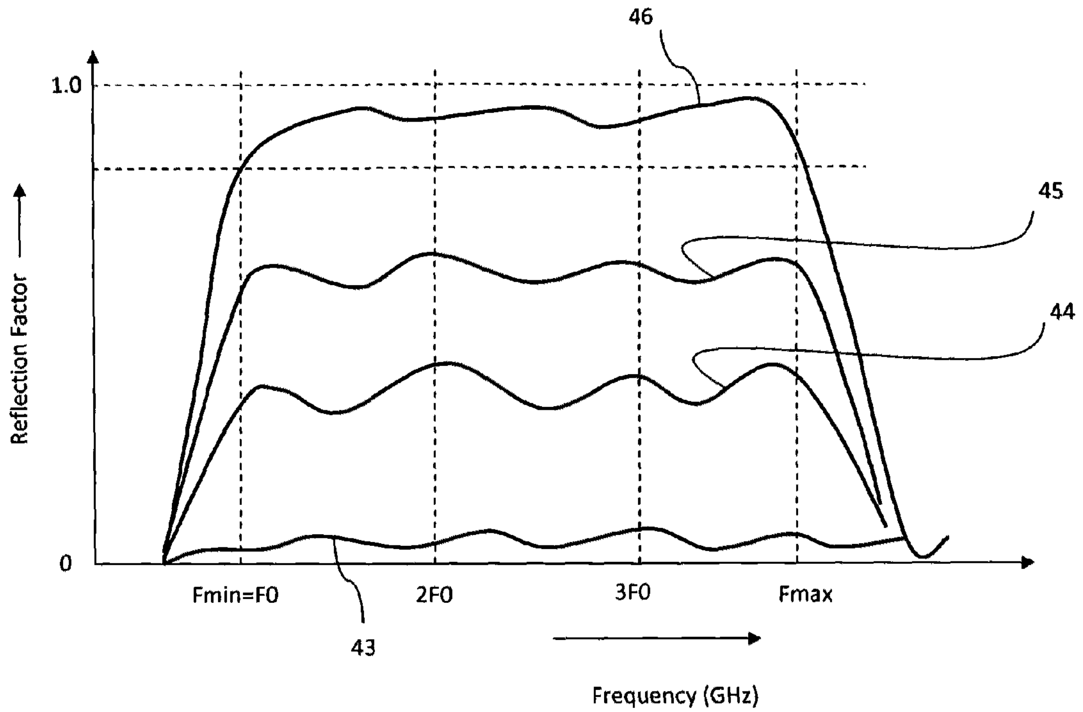
FIGURE 7: Prior art, typical frequency response of a tuner RF-probe (slug) for various distances between the probe and the central conductor of the slabline.

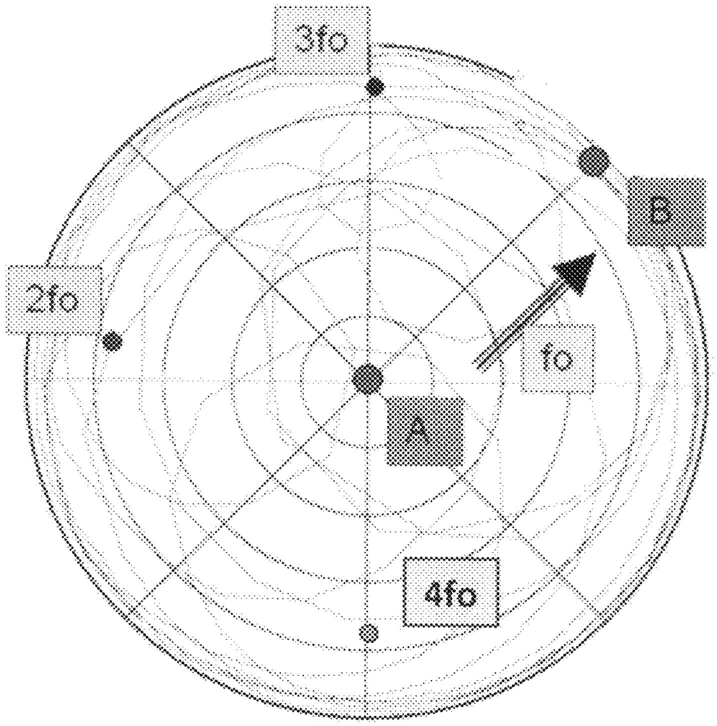
FIGURE 8: Wideband frequency response of the reflection factor on a VNA Smith chart plot, showing the impedances at four harmonic frequencies.

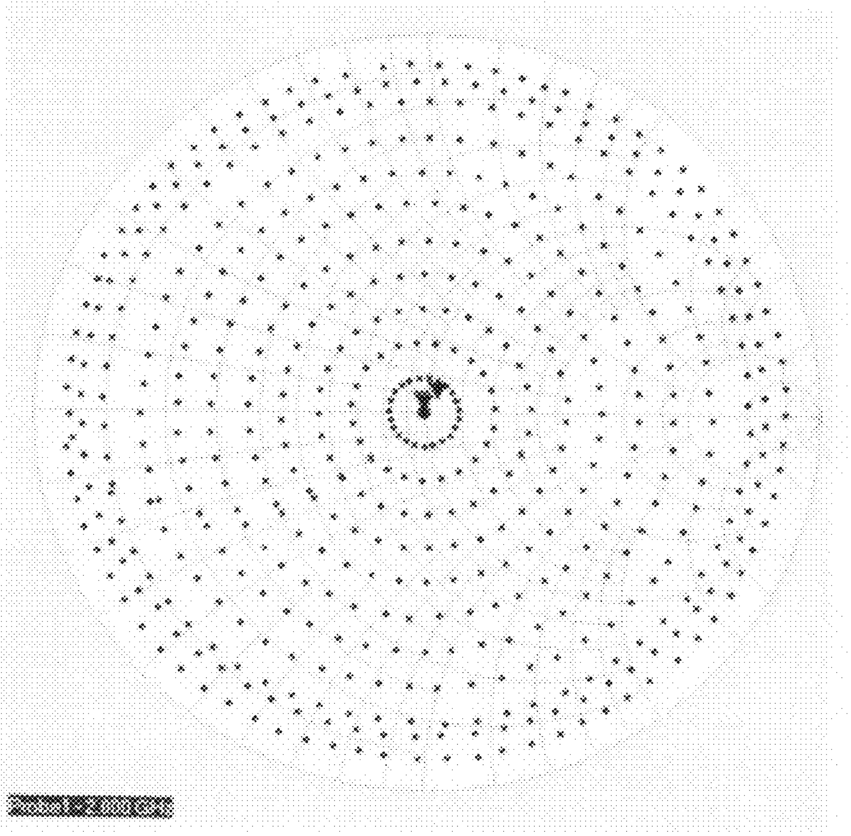
FIGURE 9: Calibration point distribution of four probe tuner at the fundamental frequency F0.

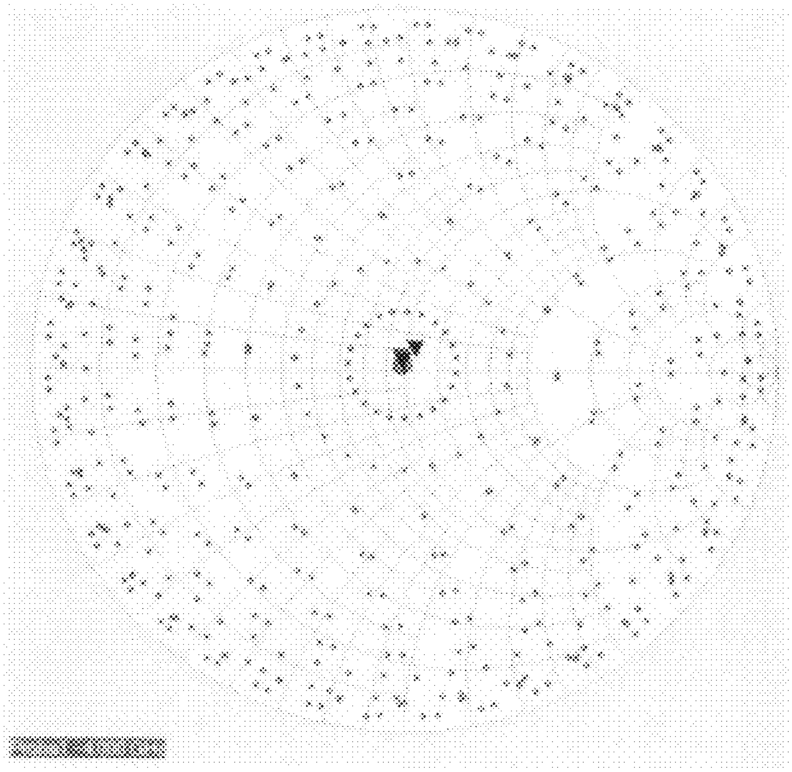
FIGURE 10: Calibration point distribution of four probe tuner at the second harmonic frequency 2F0.

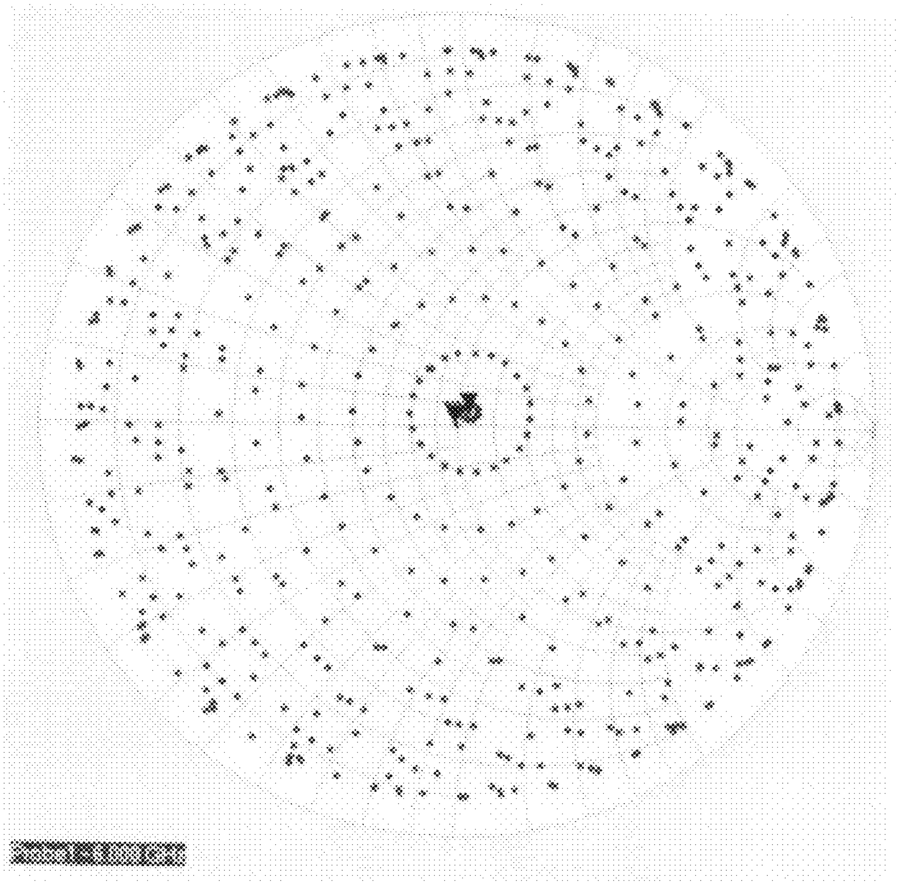
FIGURE 11: Calibration point distribution of four probe tuner at the third harmonic frequency 3F0.

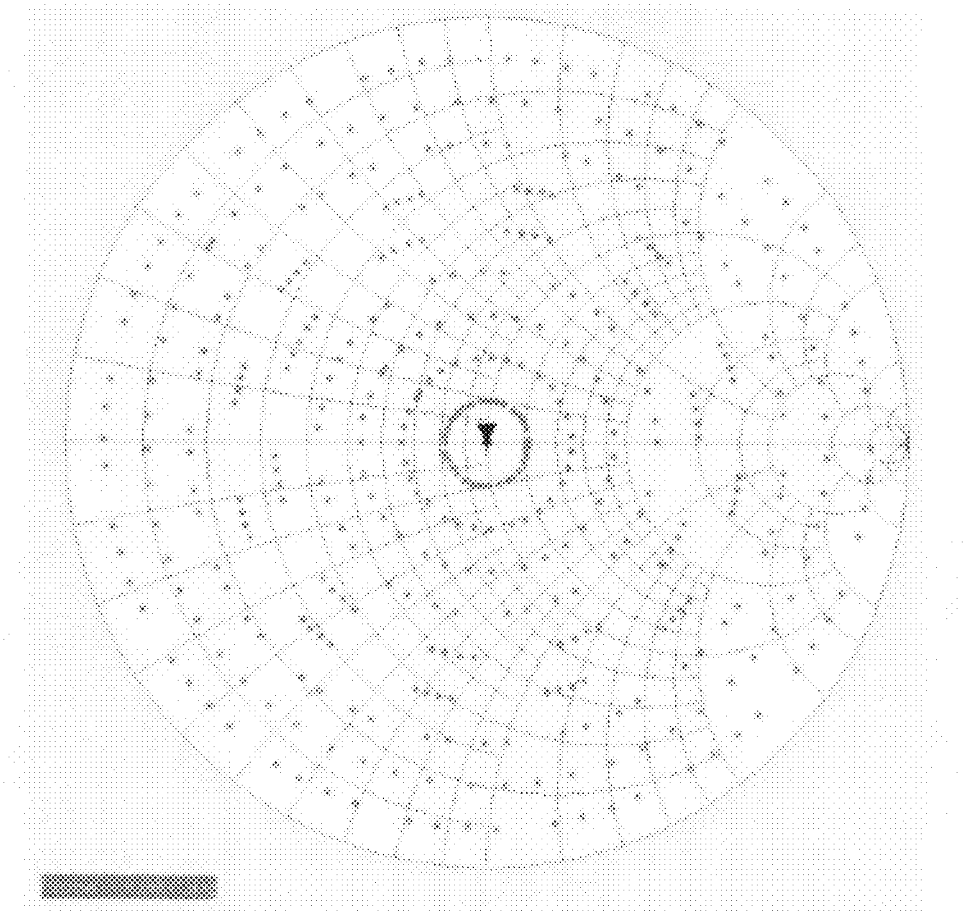
FIGURE 12: Calibration point distribution of four probe tuner at the fourth harmonic frequency 4F0.

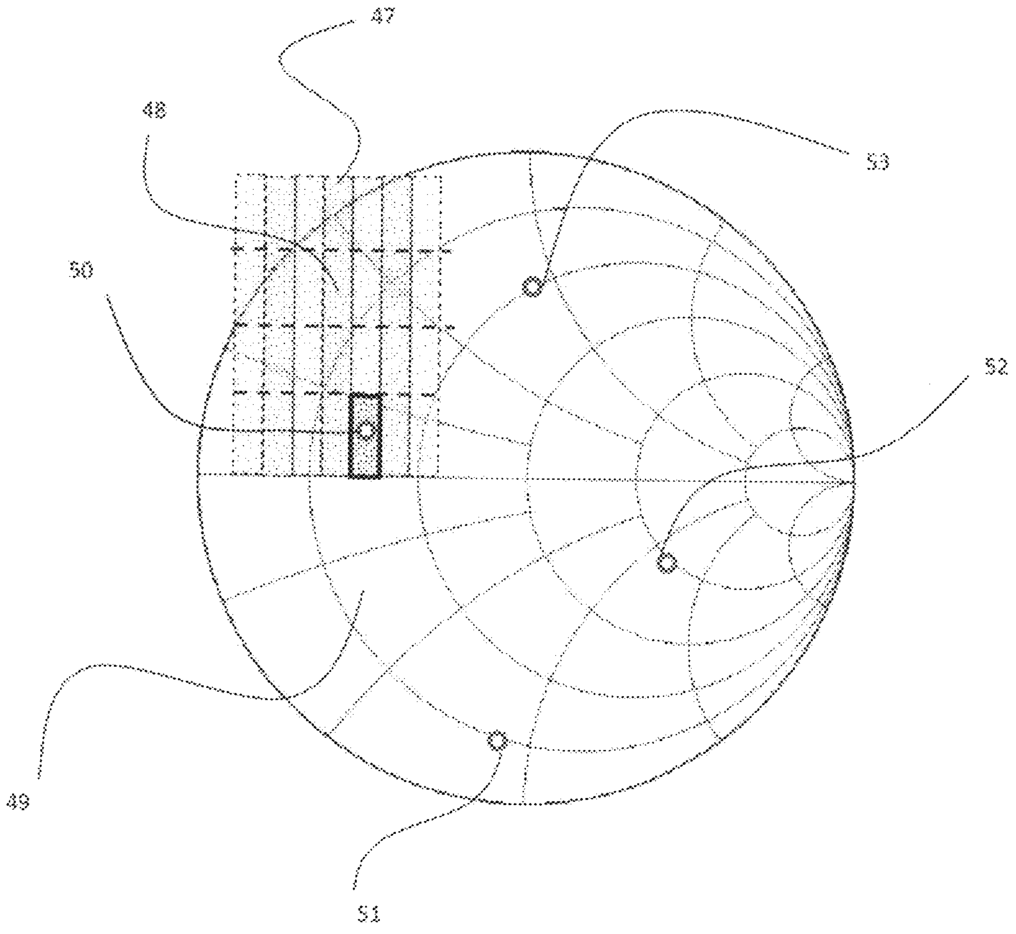
FIGURE 13: Segmentation scheme of Smith chart for accelerating numeric search. The shown rectangles spread to cover the whole surface of the Smith chart.

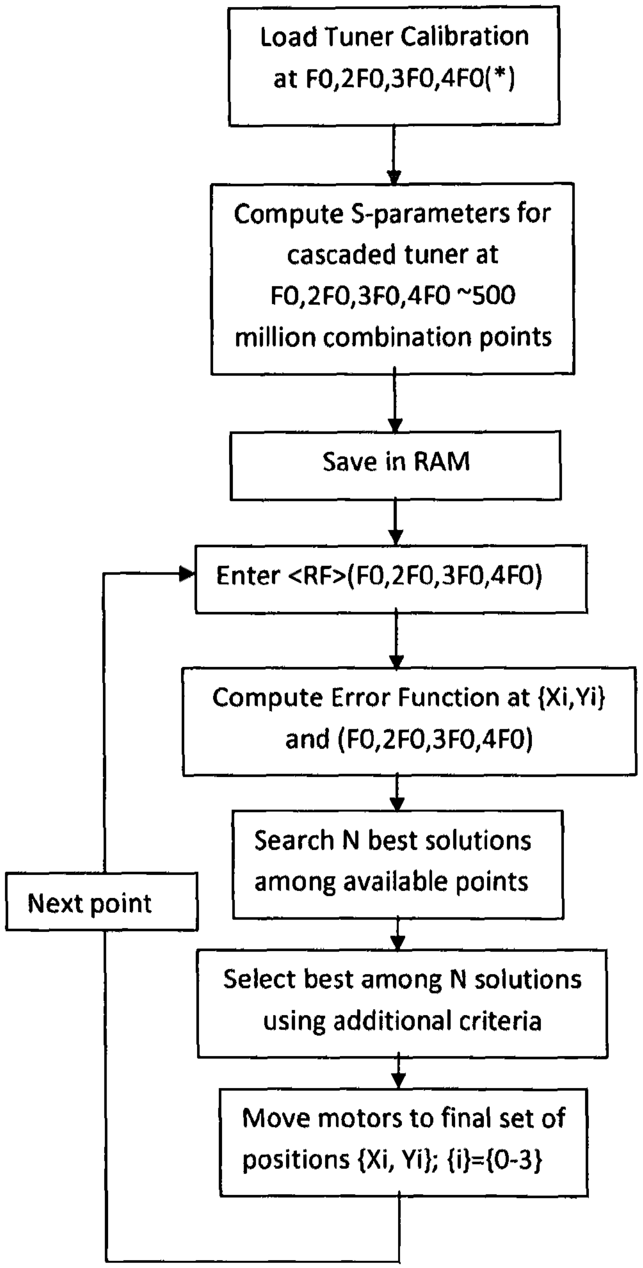
FIGURE 14: Harmonic tuning algorithm; (*) the tuning algorithm is valid as well for non-harmonic frequencies F1, F2, F3, F4.

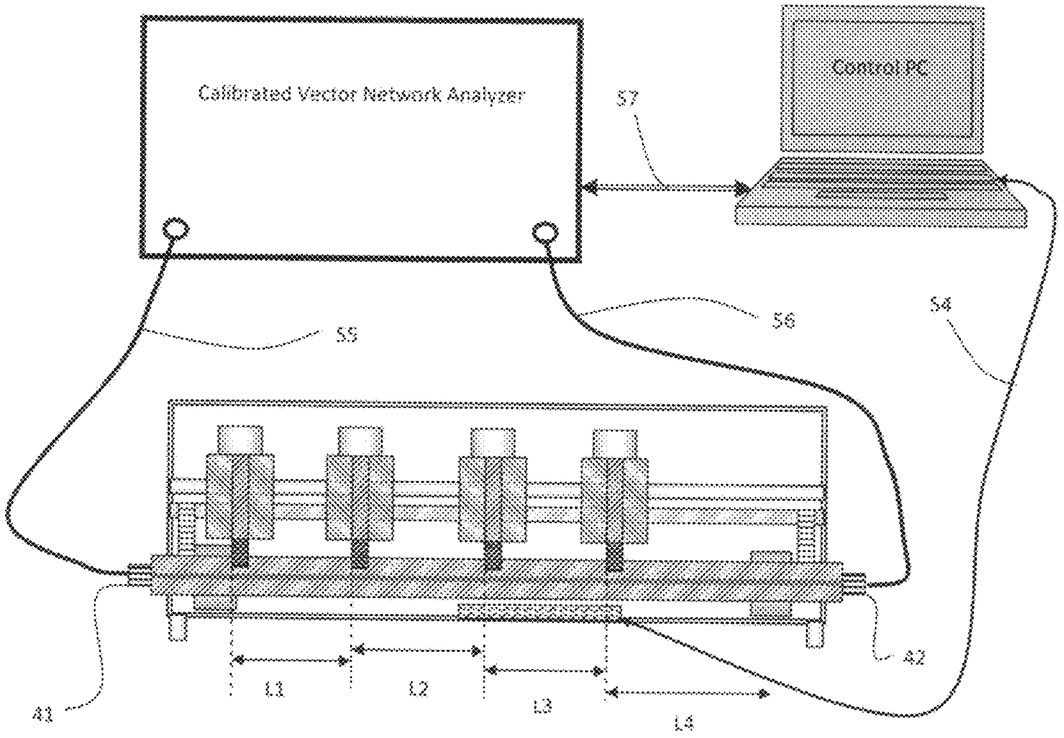
FIGURE 15: Four Probe tuner calibration on a Vector Network Analyzer

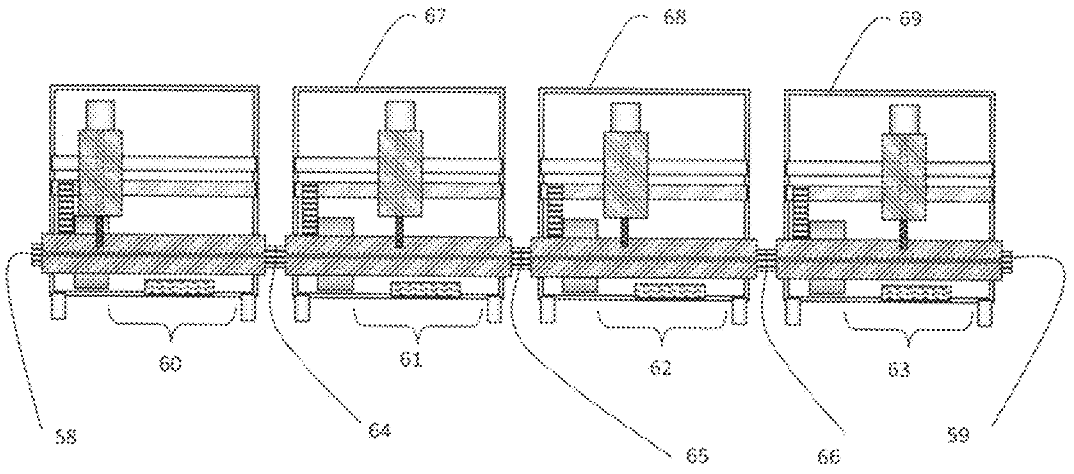
FIGURE 16: Multi-frequency tuner configuration using four cascaded tuners

HARMONIC IMPEDANCE TUNER WITH FOUR WIDEBAND PROBES AND METHOD

PRIORITY CLAIM

Not Applicable

CROSS-REFERENCE TO RELATED ARTICLES

[1] Load Pull method; microwave encyclopedia—microwaves 101.

[2] Advanced Design System (ADS); Agilent Technologies, 2000-2009.

[3] Computer Controlled Microwave Tuner—CCMT, Product Note 41, Focus Microwaves, January 1998.

[4] U.S. Pat. No. 6,674,293; Adaptable Pre-Matched Tuner System and Method.

[5] U.S. Pat. No. 7,135,941; Triple Probe Automatic Slide Screw Load Pull Tuner and Method.

[6] MPT, a universal Multi-Purpose Tuner; Product Note 79, Focus Microwaves, October 2004.

[7] U.S. Pat. No. 6,297,649; Harmonic Rejection Load Tuner.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors employing automatic microwave impedance tuners, which allow synthesizing reflection factors (or impedances) at the input and output of said transistors at various harmonic or non-harmonic frequencies [1].

Modern design of high power microwave amplifiers, oscillators and other active components, used in various communication systems, requires accurate knowledge of the active device's (microwave transistor's) RF characteristics. It is in general insufficient and inaccurate for the transistors operating at high power with high signal compression in their strongly non-linear regions to be described using analytical or numerical models only [2]. Instead the devices must be characterized using specialized test setups under the actual operating conditions (FIG. 1).

A popular method for testing and characterizing such microwave transistors for high power operation is "load pull" and "source pull" [1]. Load pull or source pull are measurement techniques employing microwave tuners (2, 4) and other microwave test equipment (1, 5). The impedance tuners, in particular, are used in order to manipulate the microwave impedance conditions under which the Device Under Test (DUT, or transistor) (3) is tested (FIG. 1). Tuners (2, 4) and measurement instruments (1, 5) are digitally controller (6, 7 and 8) by a system control computer (9).

PRIOR ART

Load Pull impedance tuners have been used since several years [3] (FIG. 2); they include single-probe wideband (also misleadingly called "fundamental") tuners, two-probe tuners capable of generating high reflection and two (harmonic) frequency tuning [4] (FIG. 3); and three-probe tuners capable of tuning at three (harmonic) frequencies [5] (FIG. 4). Single-probe tuners are called misleadingly "fundamental tuners"; this is misleading, because the reflection generated by the probe of said tuners is wideband and not restricted at the fundamental frequency (FIG. 7): high reflections are created not only at the fundamental frequency F0, but also at higher (i.e. also harmonic) frequencies, 2F0, 3F0 etc. albeit the impedances at these frequencies are uncontrollable; only the impedance at the fundamental frequency is controlled by a single probe tuner.

Impedance tuners with two [4] and three [5] independent RF probes have been used to generate independent impedances (reflection factors) at two or three frequencies [6]. It has been found that the frequencies do not have to be multiples of a base frequency F0 (harmonics); whether the frequencies are harmonics or not does not affect the calibration and calculation procedures. Only the distance between adjacent frequencies matters. It has been found that this distance needs to be approximately 0.3 to 0.5 of the lowest frequency; in case of a distance of 0.3 from the lowest frequency (Fmin) this would mean $Fmin<(F1=1.3\cdot Fmin)<(F2=1.65\cdot Fmin)$. In the case of harmonic frequencies: F0, 2F0, 3F0, 4F0, this is obviously valid. There is only experimental proof of this, no analytical relationship, so far.

Each of the single, double or triple probe tuners (FIGS. 2, 3, 4) comprises a solid housing (10), a low loss slabline (11) with a test port (12) and an idle port (13), horizontal guiding (14) and drive (15) mechanisms, driven by a horizontal stepper motor (16). Each tuner also comprises one or more mobile carriages (17), which comprise a vertical stepper motor (18) and a precision vertical axis (19). At the lower end of said vertical axis (19) there is an RF probe attached (20), which, when inserted into the slabline (11), creates high reflection factors. Each carriage has a width W (17*a*). When said probe (20) is moved horizontally by the carriage (17) the phase of the reflection factor is modified. This tuning principle s called "slide screw tuner." The tuner motors (16, 18) are controlled by an electronic interface and drivers (21) which also communicate with the control PC via a digital communication cable (22).

The basic concept of a single-probe tuner (FIG. 2) is used for all subsequent tuners presented here (FIGS. 3, 4, 5). A double-probe tuner [4] (FIG. 3) comprises all the same components as a single-probe tuner (FIG. 2) in addition to a second mobile carriage (23) and associated horizontal stepper motor (24) and lead screw. The electronic control (25) allows for controlling four motors (two vertical and two horizontal motors). The triple probe tuner [5] (FIG. 4) has an additional mobile carriage (26) and associated horizontal motor and gear drive. The electronic board (27) can control six stepper motors.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, automated load pull system, using fundamental and harmonic impedance tuners.

FIG. 2 depicts prior art, single probe, wideband (fundamental) automated impedance tuner.

FIG. 3 depicts prior art, two-probe, automated impedance tuner, capable of tuning two (harmonic) frequencies.

FIG. 4 depicts prior art, triple-probe, automated impedance tuner, capable of tuning three (harmonic) frequencies.

FIG. 5 depicts four-probe, automated impedance tuner, capable of tuning four (harmonic) frequencies.

FIG. 6 depicts prior art, double-carriage for four probe automated impedance tuner, capable of tuning four (harmonic) frequencies.

FIG. 7 depicts prior art, typical frequency response of a tuner RF-probe (slug) for various distances between the probe and the central conductor of the slabline.

FIG. 8 depicts wideband frequency response of the reflection factor on a VNA Smith chart plot, showing the impedances at four harmonic frequencies.

FIG. 9 depicts calibration point distribution of four probe tuner at the fundamental frequency F0.

FIG. 10 depicts calibration point distribution of four probe tuner at the second harmonic frequency 2F0.

FIG. 11 depicts calibration point distribution of four probe tuner at the third harmonic frequency 3F0.

FIG. 12 depicts calibration point distribution of four probe tuner at the fourth harmonic frequency 4F0.

FIG. 13 depicts segmentation scheme of Smith chart for accelerating numeric search.

FIG. 14 depicts the harmonic tuning algorithm.

FIG. 15 depicts a four probe tuner calibration setup on a Vector Network Analyzer.

FIG. 16 depicts a multi-frequency tuner configuration using four cascaded tuners

DETAILED DESCRIPTION OF THE INVENTION

The four probe impedance tuner (FIG. 5) uses basically the same concept and technology as in prior art (FIGS. 2, 3, 4). The essential difference is the number of probes. Said four-probe tuner comprises a fourth mobile carriage (28) equipped with a vertical motor (30) and a fourth tuner probe (31). The electronic board (29) can control eight stepper motors (two for each probe). For increased frequency range coverage double carriages can be used, which hold two unequal probes each (FIG. 6), (32, 33). Said probes have different sizes in horizontal direction in order to cover different, as much as possible not overlapping, frequency ranges. Each of said probes (32, 33) is controlled by a corresponding precision vertical axis (34, 35) and associated stepper motors (36, 37).

Four probe tuners have never been proposed or described before. One reason for this may be the lag of an appropriate application hereto. In terms of frequency range four probes are not offering a distinct advantage over two or three probe tuners. It may seem plausible that adding a probe to a three probe tuner would allow covering more bandwidth, but in praxis this is not true. Three probes are sufficient to create high reflection over a large bandwidth, such as the critical frequency range of 0.4 to 18 GHz (close to 5 octaves). Further increase in bandwidth requires smaller size (cross section) transmission airlines (slablines) and coaxial connectors, in order to avoid spurious electro-magnetic wave propagation modes, which appear in larger structures. Smaller slablines are, however, much more difficult to manufacture with the required mechanical precision and long enough as needed for the lower frequencies, where the wavelength is larger (λ(mm) =300/Frequency (GHz)), which exposes the actual limits of the technology.

The horizontal travel distance of each mobile carriage in all previously described tuners is important (FIGS. 2, 3, 4, 5). As shown is FIG. 5 the travel L1 to L4 must be at least one half a wavelength at the lowest frequency of operation $F_{min}$, whether these are harmonic frequencies F0, 2F0, 3F0 and 4F0 or independent frequencies F1, F2, F3, F4, with F1<F2<F3<F4.

A four probe tuner (FIG. 5) has a critical application for tuning different frequencies simultaneously and independently. In most cases these are multiples of a fundamental frequency (harmonics), since an active semiconductor device (transistor) creates such harmonic power when driven into saturation, and needs to be presented with appropriate impedances at those frequencies in order to optimize its behaviour.

It has been discovered experimentally, that wideband multi-probe tuners, such as two- or three-probe tuners may synthesize impedances at two or three frequencies simultaneously and independently. This shall not be confused with harmonic rejection tuners [7], where frequency selective resonators are used and adjusted for individual harmonic frequencies.

At this point we are not aware of any analytical proof for the multi-frequency tuning capability of multi-probe wideband tuners. Only numerical search of all possible solutions in a multi-parameter space has shown that, in fact, two independent probes allow tuning at two frequencies over the entire Smith chart and three probes at three frequencies. Up to now this has been accepted as an "axiom", i.e. a statement of which the contrary has not yet been experienced.

Consequently it has been assumed that four independent probes would allow tuning at four frequencies. Again this assumption had to be put to practical test and it was shown that, in fact, four probes allow tuning at four independent or harmonic frequencies. It has also been found, experimentally, that there must be a minimum distance between frequencies for this to happen, as mentioned before in this invention. This is, obviously, related to the fact that, when the frequencies are close together, the phase information resulting from the calibration data is not distinct enough, to ensure independent solutions. This is a common phenomenon in multi dimensional systems with several unknowns, which depend on measurement data, which, by their nature contain some measurement error. If said measurement errors add up in the wrong direction, then the overall error becomes intolerable.

It has been found, by trial and error, that a distance between adjacent frequencies between 30% and 50% of said basic frequency, would also ensure finding tuning solutions; as an example F0, F1=1.5·F0, F2=2·F0, F3=2.5·F0 works fine. But there is no analytical proof of that. On the other hand when the frequencies are multiples (harmonics) of a basic (fundamental) frequency these conditions are fulfilled, since the difference between adjacent frequencies is the basic frequency itself.

The present four probe impedance tuner allows impedance synthesis at four (harmonic or not) frequencies. Manufacturing said tuner (FIG. 5) is exponentially more difficult and tedious than manufacturing a two or three probe tuner (FIGS. 3, 4). Much more care must be taken in making and assembling the correct parts, because now four adjacent probes must align and move perfectly inside the same precision slabline, in addition to the fact that said slabline must now be longer and thus more difficult to manufacture to tight tolerances; plus all probes must cover a frequency range of at least 4:1 for a harmonic tuner (FIG. 7). The various traces in FIG. 7 show the frequency response of the reflection factor of one probe for various depths of said probe into the slabline. Trace (43) is when the probe is totally withdrawn (no reflection) and trace (46) is when the probe is closest to the central conductor of said slabline. Traces (44) and (45) represent the probe's reflection factor for intermediate positions between highest and lowest depth inside the slabline. It is obvious that the main application of the apparatus is in harmonic tuning; never the less tuners covering less bandwidth when the frequencies F1 to F4 are not harmonic frequencies and F4≦4·F1 may also have specific applications.

The frequency coverage of the four probe tuner can be extended if carriages holding two probes of different size are used (FIG. 6) instead of carriages holding a single probe (FIGS. 2-5). One set of probes (32) can then cover frequencies F0 to 4·F0 and another set of probes (33) can cover frequencies F1 to 4·F1, whereas F0 and F1 are not related. As an example let's consider a tuner which would cover fundamental frequencies from 1 to 4 GHz. In this case the first set of probes (32) shall cover $1\ GHz < F < 8\ GHz$ (or $1\ GHz < F0 < 2\ GHz$) and the second set of probes (33) shall cover $2\ GHz < F < 16\ GHz$. This way said four double-probe tuner can cover the whole bandwidth of F0=1 GHz to 4 GHz as a fundamental frequency with harmonic tuning capability up to 4·F0. This is possible as long as the coaxial connectors used at the test and idle ports of said slabline do not create higher spurious modes.

Higher electro-magnetic propagation modes are created at a certain frequency, approximately when the air gap between the ground plane (tube) and the central conductor (rod) in a coaxial structure is smaller than ⅛ of the wavelength at said frequency, also called the 'cut-off frequency'. A typical example are coaxial structures used up to 18-18.5 GHz, which have a central conductor (rod) with a diameter of ~3 mm and a ground conductor (tube) with an internal diameter of ~7 mm (also known as 1 mm coaxial line'). In this case the gap is (7 mm-3 mm)/2=2 mm, which corresponds to ⅛ Lambda at 18.75 GHz. This accuracy in calculating approximately the cut off frequency is sufficient for making tuners, since the insertion of probes often excites spurious modes in an uncontrolled fashion close to and below the cut-off frequency.

The four probe tuner must be characterized (calibrated) using a pre-calibrated vector network analyzer (VNA) FIG. 15. The tuner is connected through RF cables (55, 56) with the VNA and a digital control cable (54) with the control PC, which said PC is also connected through a digital communication cable (57) with the VNA for data collection. A calibration in general terms consists in measuring known standards and calculating correction factors, which allow accurate measurement at a given reference plane. In our case such planes are the cable connectors at the junction to the test port (41) and idle port (42) of said tuner (FIGS. 5, 15).

Since the four tuning sections are integrated inside the same housing, a modified prior art de-embedding calibration technique [4, claim 5] is used. This calibration method consists in placing the tuner probes in pre-determined positions and measuring the scattering parameters between the test port (41) and the idle port (42). For the probes (39), (40) and (31), said s-parameters are de-embedded i.e. cascaded with the inverse s-parameters of the tuner, measured when all four probes (38, 39, 40, 31) are initialized (=fully extracted from the slabline), which said set of s-parameters is saved as a 2×2 complex number matrix {S0}. S-parameters for each tuning section L1, L2, L3, L4 in FIG. 5 (a tuning section is defined as the tuner area corresponding to the horizontal movement of one probe) are saved in intermediate calibration files and then all permutations are generated in memory, by cascading the corresponding s-parameter matrices. This creates a large data base in which the tuning algorithm searches for the tuning solutions. Typical calibration patterns for four harmonic frequencies are shown in FIGS. 9 to 12.

The complexity of finding a tuning solution for four frequencies simultaneously and independently can be seen from the plot in FIG. 8. This plot shows the wideband frequency response of the four-probe tuner at its test port (41) when the idle port (42) is connected to a 50Ω load. The task at hand is to tune at the fundamental frequency F0 from the center of the Smith Charts (point A, FIG. 8) to point B, and, simultaneously keeping the reflection factors at 2F0, 3F0 and 4F0 unchanged, as shown in FIG. 8. The tuning algorithm searches in said data base, which contains all tuning permutations of said tuning sections at four harmonic (or otherwise different) frequencies. The search is accelerated by using segmentation (47) of the Smith chart (49) (FIG. 13). This segmentation is in form of many rectangular sections (48) which contain the reflection factors (50) at the basic frequency F0. Approximately 100 such segments are created to cover the whole Smith chart. This means that the search is now around 100 times faster than searching the whole data base, in order to determine the tuner probe coordinates, needed to synthesize the impedances at the other three frequencies 2F0, (51), 3F0, (52) and 4F0, (53) (or the equivalent F2, F3, F4 if non-harmonic frequencies are used). This also means the data actually loaded in RAM are 100 times less than for the whole Smith chart. For instance, if we use a 400 point impedance calibration at any frequency this would mean a search in $400^4=2.56*10^{10}$ data points, whereas if we use the segmentation the number is reduced to 256 million ($256*10^6$). Today's computers use dual or quad core processors and have 4 or 8 GB of RAM, so such data bases are easily handlebar.

The search algorithm uses known numerical optimimization methods, such as random and gradient search. The optimization target is the minimization of the Error Function "EF". The Error Function EF is defined as the sum of vector differences between calculated and target reflection factors "<RF>", for the four frequencies:

Error Function $EF=\Sigma_n$ (<RF>.target(Fi)−<RF>.calculated(Fi))

Where RF is a vector: <RF>=Real(<RF>)+j·Imag(<RF>), Fi are the calibrated frequencies F0, 2F0, 3F0 and 4F0 (or F1, F2, F3, F4 in case of nonharmonic frequencies) and the sum $\Sigma_n$ is calculated over n=4 (the number of frequencies).

It needs to be clarified that the main accent of this invention is on harmonic frequencies n·F0, not because the tuning mechanism does not work on any other combination of frequencies, such as F1, F2, F3, F4, without a specific relationship between them. It has been found that there is no need for such a relationship between frequencies in order to make independent tuning possible. It has also been found that the distance between adjacent frequencies needs to be high enough, such as $F1 < F2 < 1.5 \cdot F1$, or $F1 < F2 < 1.3 \cdot F1$, in order to obtain guaranteed tuning all areas of the Smith chart. In the case of nonlinear measurements of transistor devices (DUT), the main application for such an impedance tuner is tuning at harmonic frequencies; only harmonic frequencies are created by the DUT; if said DUT is creating uncontrollable and undesired spurious signal components, those must be eliminated anyway. Therefore the main focus of the invention on harmonic frequencies.

The concept of a four probe electro-mechanical impedance tuner, capable of independent tuning at four harmonic or non harmonic frequencies, is described here in its simplest and most effective configuration.

Alternatively a cascade of four wideband tuners with a single probe each may be used to create the same effect as a single tuner with four probes (FIG. 16). In this case the test port (58) of the first tuner is used as overall test port and the idle port of the last tuner is used as overall idle port (59). Each individual tuner must allow horizontal travelling over one half of a wavelength at the lowest frequency Fmin (60, 61, 62, and 63). The insertion loss of the adapters between tuners (64,

65, 66) limits the available reflection factor of the second (67), third (68) and fourth (69) tuner. Beyond this technical limitation, though, the same principle in calibrating and tuning applies to the cascade of four tuners as in the case of a single integrated tuner. The final setup assembly, though, is more delicate, because of connector alignment requirements; on the other hand the probe alignment in each tuner is easier during manufacturing.

Calibration of said cascaded assembly in assembled form can be done using the de-embedding method described before; the cascade of four wideband tuners can also be calibrated one tuner at a time individually and the s-parameters can be concatenated in memory in order to create the equivalent data. In this, individual calibration, case no de-embedding of the {S0} matrix is required, since each tuning section is calibrated as such.

The present invention is described in its general form of using four wideband probes in a slide screw tuner or a cascade of four wideband tuners in order to tune at (up to) four frequencies, whether in integrated form or in cascaded form. This shall not limit the validity of the claims to obvious alternative configurations, when impedance synthesis concepts other than multi-harmonic tuners are used.

What I claim as my invention is:

1. A method for independent frequency impedance synthesis (tuning), using an impedance tuner assembly comprising four wideband single probe impedance tuners, using the test port of the first tuner as overall test port and the idle port of the fourth tuner as overall idle port, said tuners being connected in cascade form, the test port of each said tuner being connected with the idle port of the previous tuner; whereby the tuners of said assembly are calibrated individually on a VNA for several probe positions, selected such as for the reflection factor to cover the whole Smith chart area from reflection factor amplitudes close to 0 and up to 1 and phases between 0 and 360 degrees by measuring the tuner's s-parameters and saving them in calibration data files; said probes of said tuners being able to create high reflection factors over a frequency range between a minimum frequency Fmin and a maximum frequency Fmax, the range between Fmin and Fmax being covered by all cascaded tuners; in case of harmonic frequencies Fmax is at least 4·Fmin and each individual tuner must cover at least this frequency range; in case of non-harmonic frequencies said individual tuners must cover a frequency range between a minimum frequency Fmin=F1 and a maximum frequency Fmax=F4, whereas F4 is larger than F1 and intermediate frequencies F2 and F3 lie between F1 and F4 and at certain distance among each other; the electronic control board of said cascaded tuners are connected such as to allow the same control computer to control independently all stepper motors of all tuners simultaneously.

2. A calibration procedure for the cascade tuner assembly of claim 1 in which said tuner assembly's test and idle ports are connected to the RF ports of a pre-calibrated VNA and scattering parameters are measured according to the following steps: at step 1 all four RF probes of said tuner assembly are lifted vertically outside said slabline in a zero vertical position and placed horizontally at a position closest to the test port and s-parameters are measured and saved as a matrix {S0} in a data file named S0; in step 2 each of said RF probes individually is placed vertically and horizontally at positions selected such as for the reflection factor created by each said probe to cover the whole Smith chart area and s-parameters are measured for each position of each probe and saved, individually for each probe, in data files or in active computer memory; step 3 is when s-parameter data saved for said tuners 2, 3 and 4 are cascaded with the inverse s-parameter matrix $\{S0\}^{-1}$, in said file S0 of the initialized tuners, and re-saved in said data files for tuners 2, 3 and 4 replacing the originally measured s-parameter data.

3. A method for independent frequency impedance synthesis (tuning) as in claim 1, in which said individual impedance tuners are integrated and operate in the same low loss slotted airline (slabline), using the test port of the first tuning section as overall test port and the idle port of the fourth tuning section as overall idle port.

4. A method for impedance tuning using calibration data of a tuner, said tuner having four probes at four different frequencies, said frequencies being or not multiples (harmonic) of a fundamental frequency, in the following steps: in a first step cascade permutations of said calibration data of the four tuner probes at the four frequencies are calculated; in a second step the combined data are divided in a large number of sections, such as 100 or higher, each representing a different segment of the Smith chart and saved in separate data files; in a third step the user enters the target reflection factors to be synthesized at up to four frequencies for which calibration data have been processed; in the following search only data of the segment which includes the target reflection factor at the fundamental frequency are considered; an error function is calculated as the vector difference between reflection factors at actual probe positions and said target reflection factors at all user specified frequencies; then the probe positions are changed and the error function is re-calculated in a systematic search for the minimum; the search terminates when changes in any probe position increase the error function.

5. A tuner position control routine uses the probe positions calculated by the tuning method of claim 1 or claim 4, activates motor control and places all said tuner probes to the calculated positions, allowing the physical synthesis of targeted reflection factors at all four frequencies.

* * * * *